United States Patent
Eilers et al.

(10) Patent No.: US 6,649,432 B1
(45) Date of Patent: Nov. 18, 2003

(54) RESONANT MICROCAVITY DISPLAY UTILIZING MIRRORS EXHIBITING ANOMALOUS PHASE DISPERSION

(75) Inventors: Hergen Eilers, Palo Alto, CA (US); Steven M. Jaffe, Palo Alto, CA (US); Brian L. Olmsted, Menlo Park, CA (US); Michieal L. Jones, Davis, CA (US)

(73) Assignee: Quantum Vision, Inc., Menlo Park, CA (US)

( * ) Notice: Subject to any disclaimer, the term of this patent is extended or adjusted under 35 U.S.C. 154(b) by 163 days.

(21) Appl. No.: 09/695,630

(22) Filed: Oct. 24, 2000

Related U.S. Application Data
(60) Provisional application No. 60/161,248, filed on Oct. 25, 1999.

(51) Int. Cl.[7] .............................................. H01L 21/00
(52) U.S. Cl. .............................. 438/22; 438/46; 438/47
(58) Field of Search .................................. 313/461, 463, 313/466, 474; 438/22, 46, 47; 257/94

(56) References Cited

U.S. PATENT DOCUMENTS

| | | | | |
|---|---|---|---|---|
| 5,052,016 A | * | 9/1991 | Mahbobzadeh et al. | ...... 372/96 |
| 5,249,195 A | * | 9/1993 | Feldman et al. | ............... 372/45 |
| 5,315,128 A | * | 5/1994 | Hunt et al. | .................... 257/16 |
| 5,469,018 A | | 11/1995 | Jacobsen et al. | ............ 313/461 |
| 5,804,919 A | * | 9/1998 | Jacobsen et al. | ............ 313/506 |

* cited by examiner

*Primary Examiner*—David V. Bruce
*Assistant Examiner*—Jurie Yun
(74) *Attorney, Agent, or Firm*—Fliesler Dubb Meyer & Lovejoy LLP

(57) ABSTRACT

A resonant microcavity display comprises a thin-film resonant microcavity (20, 50, 60) with an active layer (21). The microcavity (20, 50, 60) comprises a front reflector (22, 52), the active region (21) deposited upon the front reflector, and a back reflector (20, 54) deposited upon the active region (21). The display preferentially emits light that propagates along the axis (27) perpendicular to the plane of the display, due to its quantum mechanical properties. The extrinsic efficiency of this device is increased by the use of thin film construction with anomalous phase dispersion.

18 Claims, 3 Drawing Sheets

- prior art -

RESONANT MICROCAVITY DISPLAY UTILIZING MIRRORS EXHIBITING ANOMALOUS PHASE DISPERSION

This application claims priority to U.S. Provisional Patent Application, Serial No. 60/161,248, filed Oct. 25, 1999.

FIELD OF THE INVENTION

The present invention relates to a luminescent device comprising a resonant microcavity having an active region.

BACKGROUND OF THE INVENTION

In issued U.S. Pat. No. 5,469,018, which is incorporated herein by reference along with PCT Application PCT/US94/08306 (International Publication No. WO 95/03621), a resonant microcavity display and method of making same are disclosed. A resonant microcavity display is a luminescent display incorporating a thin-film phosphor embedded in a resonant microcavity. The microcavity resonator consists typically of an active region comprising a phosphor sandwiched between two reflectors or mirrors.

A display is further formed by coupling an excitation source to the microcavity. The phosphor inside the microcavity may be excited through several means including bombardment by externally generated electrons (cathodoluminescence), excitation by electrodes placed across the active layer to create an electric field (electroluminescence) or excitation using photons (photoluminescence).

The resonant microcavity display is typically characterized by a highly directional, monochromatic light distribution, oriented normal to the plane of the microcavity. As a result of the geometric design of the resonant microcavity, a resonant standing wave or traveling wave is produced which through constructive interference increases the emission of light in the forward direction, i.e., the direction perpendicular to the plane of the active layer. This light has the same frequency as the microcavity resonance and is thus monochromatic. The amount of light emitted in directions other than perpendicular to the active layer and at other frequencies other than the resonance is decreased because there is destructive interference in these directions and frequencies. The exact properties of the resonant microcavity display are calculated using quantum electrodynamics and solving Maxwell's equations for the specific microcavity.

SUMMARY OF THE INVENTION

The subject invention is a resonant microcavity display utilizing mirrors which exhibit anomalous phase dispersion. It is the purpose of this invention to increase the amount of useable light generated by optimizing the internal net phase of the microcavity for all angles and wavelengths of potential emission. Anamolous phase dispersion can be defined as phase dispersion which is not an positive linear function of (cosine theta)/lambda, but rather decreasing, unchanging, or nonlinear over some useable range.

Altering the phase dispersion can increase or decrease the resonance mode volume in both wavelength and angle. This invention describes specific techniques to control both desired and undesired resonances.

Other objects and advantages of the present invention will become apparent to those skilled in the art from the following detailed description of the illustrated embodiments when read in light of the accompanying drawings.

DETAILED DESCRIPTION OF THE PREFERRED EMBODIMENT

Figure 1:
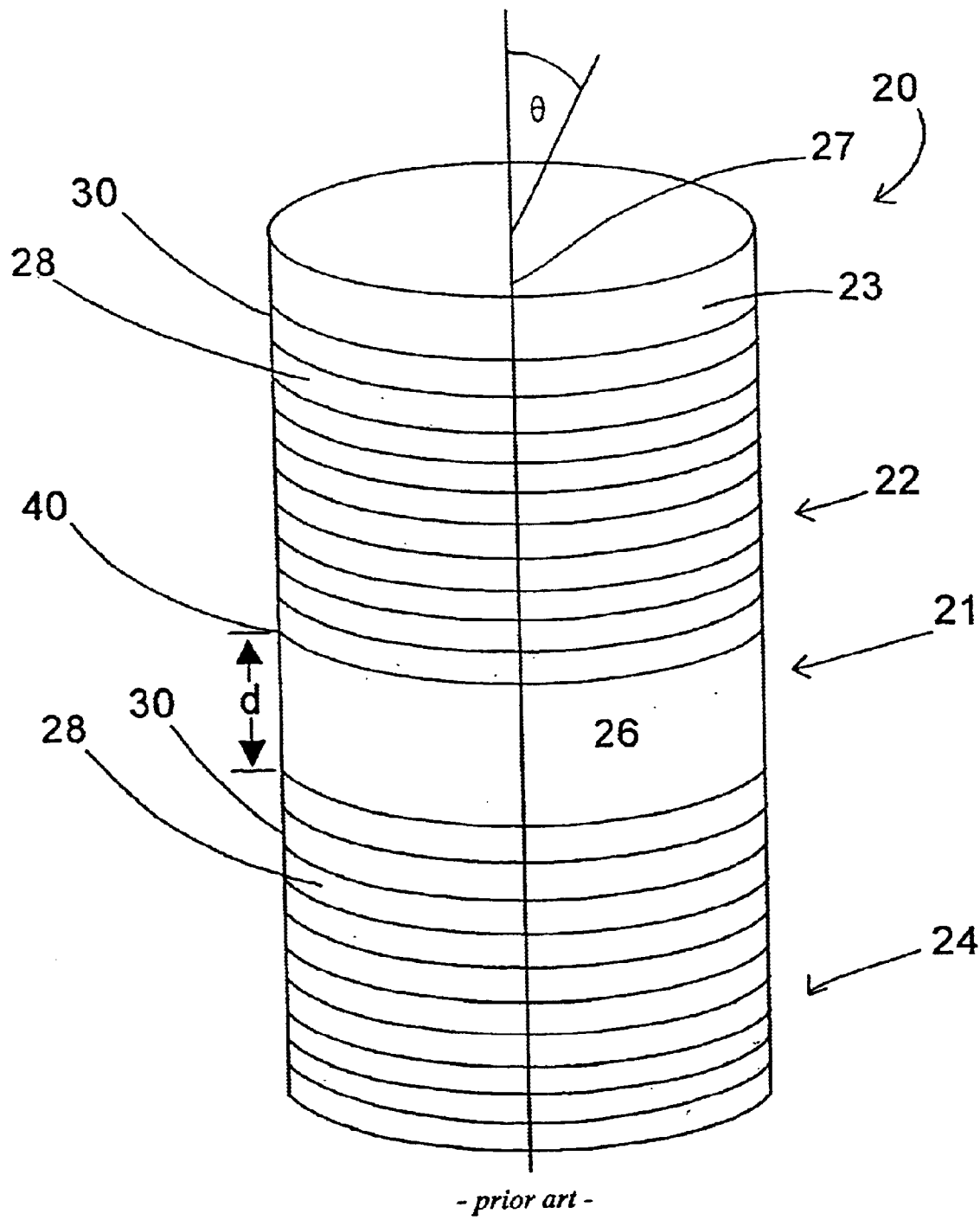
FIG. 1 illustrates one typical embodiment of a resonant microcavity display. The mirrors are formed using λ/4 stacks of high and low index of refraction dielectric materials. No excitation source is depicted.

FIG. 1 illustrates a resonant microcavity 20, with an active region 21 preferably containing a phosphor, and front and back mirrors 22, 24, and grown on a substrate 23. For discussion purposes the phosphor is assumed to be transparent and isotropic since this corresponds to the majority of phosphors. While this embodiment has an active region containing an isotropic, transparent phosphor, other embodiments can have active regions of different designs. By way of example, the active regions could be comprised of anisotropic phosphors, semiconductor devices, quantum wells, organic materials, and/or other inorganic materials.

The spontaneously emitted light from the phosphor in the active region 21 can be described by the use of cavity quantum electrodynamic (QED) theory. To first order, cavity QED predicts that the spontaneous emission into a certain optical mode is proportional to the intensity of that mode at the location of the emitter. This effect is described by Fermi's Golden Rule. In free space, all modes have equal amplitude resulting in isotropic emission and no control of the emitted light. However, within a microcavity the amplitude of the existing modes may be greatly altered. Modes may be resonantly enhanced through constructive interference or suppressed through antiresonant destructive interference. Provided that the altered modes overlap the natural emission bands, a phosphor will show greater emission into enhanced modes and weaker emission into suppressed modes. In other words, the direction, wavelength, and polarization of light emitted by the phosphor can be controlled by the cavity.

Since energy is conserved, the rate of emission into each mode is determined by a competition between all available modes. Enhancing the rate of emission into one mode necessarily results in a decrease in the rate of emission into the remaining modes. Alternatively, suppressing the rate of emission into a majority of modes will effectively enhance the emission into a few non-suppressed modes.

In the case of a coplanar microcavity, constructive interference and enhancement occurs when the internal net phase change due to all possible round trips within the cavity is sufficiently close to an integral multiple of pi. Destructive interference and suppression occurs when the internal net phase is sufficiently different from a multiple of pi.

The peak of the resonance occurs when the internal net phase change is exactly a multiple of pi. The amplitude of this resonance peak, and the corresponding strength of the enhancement, depends on the magnitude of the reflectance of the mirrors at this angle, wavelength and polarization. Likewise the amplitude of a suppression minima depends on the magnitude of the reflectance of the mirrors.

Summarizing, if either the wavelength or angle of a coplanar microcavity is changed while the other variable remains constant, one observes peaks and dips in output. The amplitude of these peaks and dips depends only upon the magnitude of the reflectance of the structure while the width, "shape", and location of these features also depends upon the internal net phase.

The internal net phase may be expressed as:

$$phi = 2 \pi n d/lambda \cos(theta) + phi1 + phi2$$

where n is the refractive index of the active layer, d is the physical thickness of the active layer, lambda is the free space wavelength of the emitted light, theta is the angle with respect to the cavity axis as measured within the active layer, and phi1 and phi2 are the net phase shifts upon reflection from the two mirrors. Phi1 and phi2 are functions of the angle, wavelength, and polarization.

Normally, phi1 and phi2 are approximately proportional to cos(theta)/lambda over any small range of wavelengths or angles. Therefore, the net cavity phase may be normally approximated by phi=2 pi n dprime/lambda cos(theta). Dprime is referred to as the effective cavity length and is relatively constant over any small range of angles. The circumstance where dprime is a positive constant is referred to as normal phase dispersion.

The total amount of emission into a specified range of angles, wavelengths and polarizations is obtained by integrating the relative probability of emission over the specified range. If emission is desired over a range of wavelengths and angles, the internal net phase should be adjusted such that a strong resonance peak is maintained over as much of the range as possible. In this circumstance, mirrors exhibiting a negative phase dispersion over this wavelength and angle range will be useful. This negative phase dispersion will subtract from the positive phase dispersion due to the cavity thickness leading to an extended resonance. If more than one resonance is to be contained within this range of wavelengths and angles the internal net phase should vary slowly when near a multiple of pi and rapidly when sufficiently different from pi. Mirrors with large regions of low or negative phase dispersion separated by small regions of very high positive phase dispersion are useful in this circumstance.

If emission is not desired over this range of wavelengths the internal net phase should be adjusted such that strong antiresonance is maintained over as much of the range as possible. In this circumstance, the internal net phase should vary slowly when far from a multiple of pi and rapidly when near pi. Mirrors with large regions of low or negative phase dispersion separated by small regions of very high positive phase dispersion are once again useful in this circumstance.

The phase dispersion of a mirror design is determined by the index profile of the mirror design. The mirror phase dispersion results from the addition of the multiple reflectance from each interface between layers such as layers 28 and 30 in FIG. 1. The maximum contribution to the mirror reflectance results from the first interface 40 surrounding the active region 21.

Increasing the reflectance of the first interface will minimize the phase dispersion for angles near normal incidence. This result can be obtained by increasing the contrast between the refractive index of the active material in the active region and the refractive index of the adjacent mirror material. Also, selecting mirror materials that offer the highest contrast between the high refractive index material and the low refractive index material within the mirror stack can minimize the phase dispersion. Phase dispersion due to the active region 21 can be minimized for all angles by utilizing a resonant microcavity structure with a thinner active layer.

Metals such as aluminum, magnesium, and silver exhibit negative phase dispersion for P-polarized light. In addition, metal mirrors which exhibit the greatest negative dispersion for P-polarized light exhibit the least positive dispersion for S-polarized light. In this regard, an Al mirror is superior to a Ag mirror, and a Mg mirror is almost as good as an Al mirror.

The most dramatic alteration of the net phase dispersion of a microcavity may be achieved through the use of a resonant mirror structure such as the "dispersionless mirror" described by H. Bohme in Dielektrische Mehrfachschichtsysteme ohne Dispersion des Phasensprungs (1984). In the dispersionless mirror design of Bohme, the basic mirror configuration consists of a lambda/4 stack containing certain layers with an index intermediate between the high and low index of the basic lambda/4 stack.

In general a variety of anomalous phase dispersion mirrors may be produced by the incorporation of resonant Fabry-Perot cavities in the mirrors. The design of Bohme is one example of this type. This produces a microcavity structurally similar to dielectric square bandpass filters as described in Jacobs, Carol, "Dielectric Square Bandpass Design", Mar. 15, 1981/Vol. 20, No. 6/Applied Optics, pp. 1039–1042. The coupled resonant cavities form a mirror which produces anomalous phase dispersion near the mirror resonances.

In any of the resonant mirror designs, the objective is to use the phase of the reflection from certain interfaces to counteract the angular and/or wavelength dependence of the reflection from adjacent layers. The exact index profile is determined by the amount and type of phase dispersion relationship desired, subject to the practical limitations of thin film deposition processes. It is also generally true that a resonant structure exhibiting strong anomalous phase dispersion will require more layers to achieve a given reflectance magnitude than a normally dispersive quarter wavelength stack.

Figure 2:
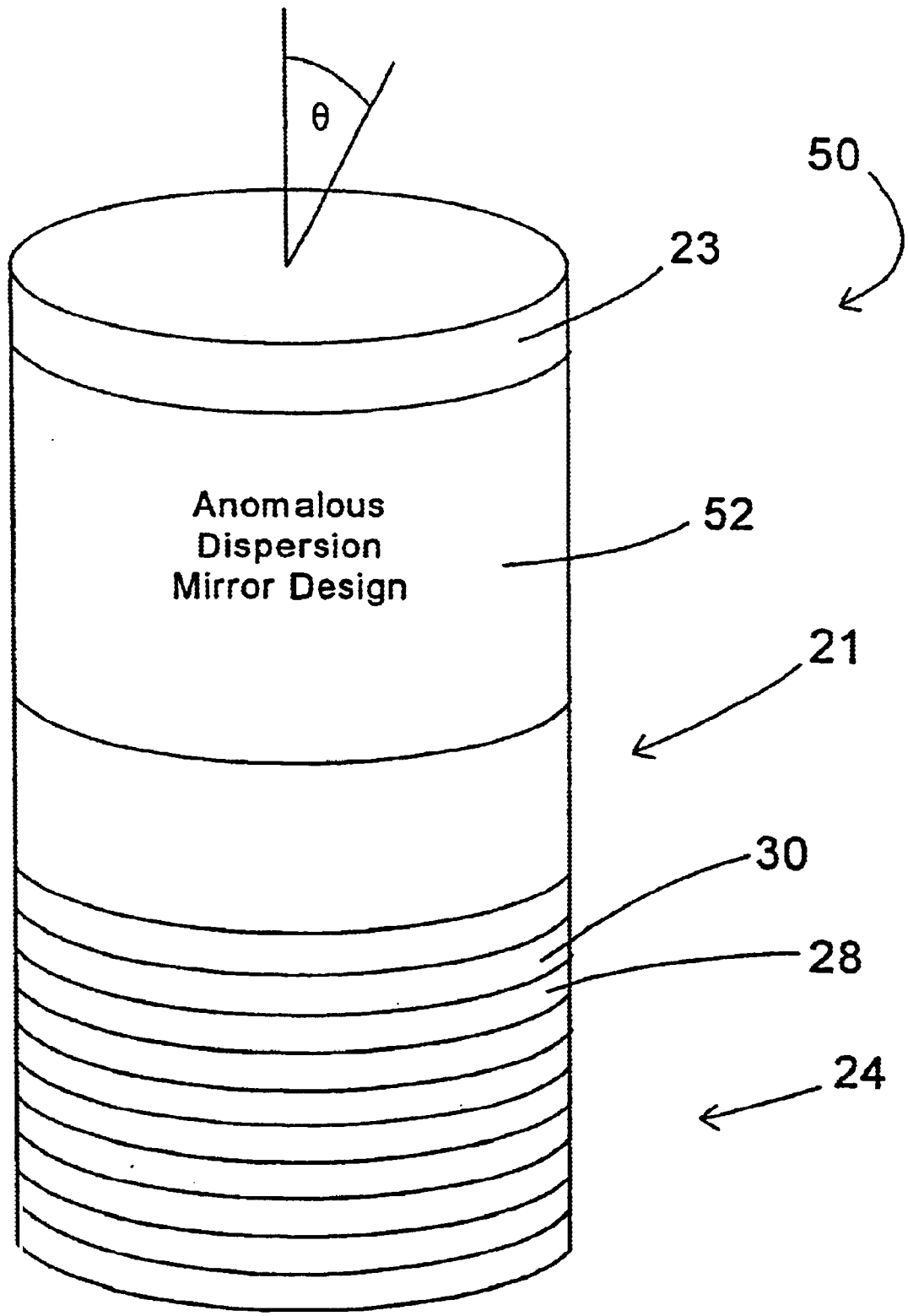
FIG. 2 illustrates a resonant microcavity of the invention incorporating a front mirror exhibiting anomalous dispersion.

To incorporate an anomalous phase dispersion mirror, one replaces the front and/or rear reflectors of a resonant microcavity 50 which exhibit a normal phase dispersion with a resonant mirror exhibiting anomalous phase dispersion. One example is depicted in FIG. 2. The amount of anomalous phase dispersion for a given range of angles and wavelengths is optimized for each application. Typically, one attempts to cancel the effects of positive phase dispersion in the active layer or region for a certain range of angles. This angular range is a function of the criteria that defines the usable light.

To optimize a microcavity design which exhibits anomalous phase dispersion, one must calculate the emission rates into all radiative and waveguide modes for each design to determine the effect. Modifying the index profile from the simple λ/4 stack design will not only affect the phase dispersion, but can increase or decrease the mirror reflectance. In addition, the emission rate into the waveguide modes will be affected by the construction of the resonant microcavity. The integrated emission probability and thereby the amount of usable light can increase or decrease when altering the phase dispersion. Thus, the optimum design will alter the phase dispersion in the mirrors and active regions until the integrated emission probability reaches a maximum.

Figure 3:
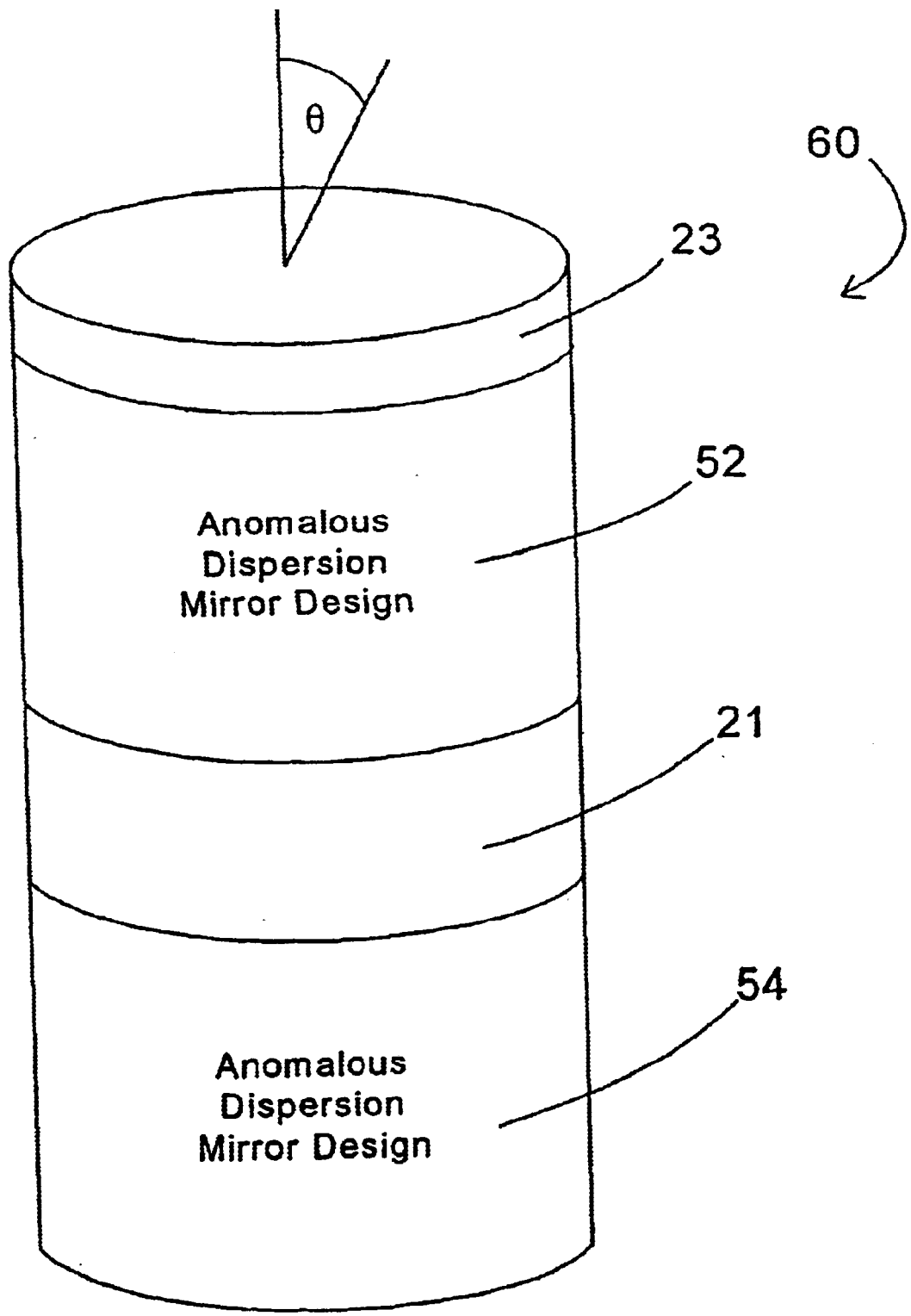
FIG. 3 illustrates a resonant microcavity of the invention incorporating a front mirror exhibiting anomalous phase dispersion and a back mirror exhibiting anomalous phase dispersion.

FIG. 3 depicts a resonant microcavity 60 which has a resonant front mirror exhibiting anomalous dispersion 52, an active region 21, and a resonant back mirror exhibiting anomalous dispersion 54.

Other variations of the above invention can include the following. In one variation, the resonant microcavity device includes a plurality of microcavity placed in optical contact. Each of these resonant microcavities includes an active region. Each of the microcavities includes front and back mirror pairs. In this structure the other resonant cavities act as set of resonant mirrors adjacent to any one active region.

A further variation can include the microcavities as depicted in FIGS. 2 and 3 with multiple active regions provided between the front and back reflectors or mirrors. It is also to be understood that the above active regions can include a semiconductor device, a semiconductor material, quantum well or other quantum size effect device, an organic material or an inorganic material such as a phosphor. Further, it is to be understood that if desired, the active region of one or more of these resonant microcavity devices can be devoid of any active material or device and thus, operate, if desired, as a reflective mirror.

In addition to improving the efficiency of a microcavity, the phase dispersion can be adjusted to control the uniformity of the microcavity emission as a function of angle.

INDUSTRIAL APPLICABILITY

From the above, it can be seen that the present invention enhances emission of usable light in a desired direction from a microcavity. Such a microcavity can be comprised of an active region with one or more resonant mirrors exhibiting anomalous phase dispersion.

Other features, aspects and objects of the invention can be obtained from a review of the figures and the claims.

It is to be understood that other embodiments of the invention can be developed and fall within the spirit and scope of the invention and claims.

We claim:

1. A method of making a resonant microcavity including the steps of:

forming a resonant microcavity with an active region and a reflective region;

during the forming step, using an anomalous phase dispersion mirror to reduce the amount of dispersion in at least one of (1) the active region, and (2) the reflective region in order to cause the rate of usable light emission to increase.

2. The method of claim 1 wherein for the reducing step, the rate of emission is given by integrating the probability for emission into a specific mode over angle space and wavelength space.

3. A method according to claim 1, wherein:

the forming step includes forming a resonant microcavity with an active region capable of having spontaneous light emission.

4. A method according to claim 1, wherein:

using an anomalous phase dispersion mirror comprises using an anomalous phase dispersion mirror positioned adjacent to the active region.

5. A method according to claim 1, wherein:

the forming step includes forming a resonant microcavity with an active region that includes one of a semiconductor device, a semiconductor material, a quantum well, an organic material, and an inorganic material.

6. A method according to claim 1, wherein:

the forming step includes forming a resonant microcavity with an active region that includes a phosphor.

7. A method according to claim 1, wherein:

using an anomalous phase dispersion mirror comprises using an anomalous phase dispersion mirror that includes multiple thin film layers, some of said layers having a high refractive index, some of said layers having a low refractive index, and some of said layers having an intermediate refractive index lying between the high refractive index and the low refractive index.

8. A method according to claim 1, wherein:

using an anomalous phase dispersion mirror comprises using an anomalous phase dispersion mirror that includes multiple thin film layers, some of said layers having a high refractive index, some of said layers having a low refractive index, and some of said layers having an intermediate refractive index lying between the high refractive index and the low refractive index; and wherein said layers with said high, low, and intermediate refractive indices are intermixed.

9. A method according to claim 1, wherein:

using an anomalous phase dispersion mirror comprises using an anomalous phase dispersion mirror that is comprised of layers, each of said layers having an refractive index in order to define an index profile for the mirror, and said index profile controls the dispersion characteristics of said anomalous phase dispersion mirror.

10. A method according to claim 1, wherein:

using an anomalous phase dispersion mirror comprises using an anomalous phase dispersion mirror that is comprised of a Fabry-Perot cavity.

11. A method according to claim 1, wherein:

using an anomalous phase dispersion mirror comprises using an anomalous phase dispersion mirror that is comprised of a second microcavity.

12. A method of making a resonant microcavity including the steps of:

forming a resonant microcavity with an active region and a reflective region;

during the forming step using an anomalous phase dispersion mirror to reduce the amount of dispersion in at least one of (1) the active region, and (2) the reflective region in order to cause an integrated emission probability to increase.

13. The method of claim 12 wherein said reducing step includes:

reducing the amount of dispersion in at least one of (1) the reflective region, and (2) the active region until the integrated emission probability reaches a maximum.

14. A method according to claim 12, wherein:

the reflective region is a first reflective region, and wherein the forming step includes forming a resonant microcavity having a second reflective region, the active region being positioned between the first reflective region and the second reflective region; and during the forming step, using an anomalous phase dispersion mirror to reduce the amount of dispersion in at least one of (1) the active region, (2) the first reflective region, and (3) the second reflective region, in order to cause the rate of usable light emission to increase.

15. A method according to claim 14, wherein:

one of the reflective region and second reflective region includes said anomalous phase dispersion mirror.

16. A method according to claim 14, wherein:

said first reflective region includes a front anomalous phase dispersion mirror and said second reflective region includes a rear anomalous phase dispersion mirror.

17. A method according to claim 14, wherein:
one of said first and second reflective regions includes a resonant multi-layer mirror.

18. A method according to claim 14, wherein:
the forming step comprises forming a resonant microcavity with an active region positioned between the first reflective region and a second reflective region, wherein one of said first and second reflective regions includes a resonant mirror with multiple thin film layers comprised on both high refractive index materials and low refractive index materials and wherein the number of layers of the mirror is minimized for a specific desired reflectance by increasing the contrast between the high refractive index materials and the low refractive index materials.

* * * * *

UNITED STATES PATENT AND TRADEMARK OFFICE
CERTIFICATE OF CORRECTION

PATENT NO. : 6,649,432 B1 Page 1 of 1
DATED : November 18, 2003
INVENTOR(S) : Eilers, Hergen It is certified that error appears in the above-identified patent and that said Letters Patent is hereby corrected as shown below:

Title page,
Item [*] Notice, should read -- Subject to any disclaimer, the term of this patent is extended or adjusted under 35 U.S.C. 154 (b) by 164 days. --

Signed and Sealed this

Sixth Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,649,432 B1
DATED : November 18, 2003
INVENTOR(S) : Eilers et al.

It is certified that error appears in the above-identified patent and that said Letters Patent is hereby corrected as shown below:

Title page,
Item [*] Notice, delete the phrase "by 163 days" and insert -- by 164 days --

Signed and Sealed this

Twenty-eighth Day of September, 2004

JON W. DUDAS
*Director of the United States Patent and Trademark Office*